United States Patent
Lee et al.

(10) Patent No.: US 11,409,395 B2
(45) Date of Patent: Aug. 9, 2022

(54) TESTING DEVICE OF DISPLAY MODULE, TESTING SYSTEM INCLUDING THE SAME, AND TESTING METHOD USING THE SAME

(71) Applicant: Samsung Display Co., Ltd., Yongin-si (KR)

(72) Inventors: Il Ho Lee, Hwaseong-si (KR); Sanghyuk Kwon, Seoul (KR); Yeongbin Kim, Ulsan (KR); Chansik Noh, Yesan-gun (KR); Eunchul Shin, Cheonan-si (KR); Sangmin Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 289 days.

(21) Appl. No.: 16/667,335

(22) Filed: Oct. 29, 2019

(65) Prior Publication Data

US 2020/0192524 A1 Jun. 18, 2020

(30) Foreign Application Priority Data

Dec. 13, 2018 (KR) ........................ 10-2018-0161103

(51) Int. Cl.
*G06F 3/044* (2006.01)
*G01R 27/26* (2006.01)
*G01R 31/28* (2006.01)
*G09G 3/00* (2006.01)

(52) U.S. Cl.
CPC ....... *G06F 3/0445* (2019.05); *G01R 27/2605* (2013.01); *G01R 31/2825* (2013.01); *G06F 3/044* (2013.01); *G09G 3/006* (2013.01); *G06F 2203/04112* (2013.01)

(58) Field of Classification Search
CPC ...... G06F 3/0445; G06F 3/044; G06F 3/0446; G06F 2203/04112; G06F 3/0443; G09G 3/006; G09G 2354/00; G01R 27/2605; G01R 31/2825
See application file for complete search history.

(56) References Cited

U.S. PATENT DOCUMENTS

| | | | |
|---|---|---|---|
| 11,048,370 B2* | 6/2021 | Ko | G06F 3/0412 |
| 11,087,694 B2* | 8/2021 | Park | G09G 3/3233 |
| 2014/0354286 A1* | 12/2014 | Kim | G09G 3/3225 |
| | | | 324/414 |

FOREIGN PATENT DOCUMENTS

| | | |
|---|---|---|
| JP | H 06-027494 | 2/1994 |
| KR | 10-2004-0072285 | 8/2004 |
| KR | 10-2014-0056659 | 5/2014 |
| KR | 10-2018-0073126 | 7/2018 |
| KR | 10-2018-0073296 | 7/2018 |

* cited by examiner

*Primary Examiner* — Amy He
(74) *Attorney, Agent, or Firm* — H.C. Park & Associates, PLC

(57) ABSTRACT

A testing device for testing a display module may include touch test pads electrically connected to touch pads of a display module, a first power test pad and a second power test pad electrically connected to a first power pad and a second power pad of the display module, a voltage generator providing a first test power voltage and a second power test voltage to the first power test pad and second power test pad, and a capacitance measurement circuit measuring capacitance between the first power test pad and second power test pad.

17 Claims, 13 Drawing Sheets

TESTING DEVICE OF DISPLAY MODULE, TESTING SYSTEM INCLUDING THE SAME, AND TESTING METHOD USING THE SAME

CROSS-REFERENCE TO RELATED APPLICATIONS

This application claims priority from and the benefit of Korean Patent Application No. 10-2018-0161103, filed on Dec. 13, 2018, which is hereby incorporated by reference for all purposes as if fully set forth herein.

BACKGROUND OF THE INVENTION

Field

Exemplary embodiments of the invention relate generally to display/touch panel testing and, more specifically, to a testing device and a testing system, which can measure capacitance of a display panel in a step of testing a touch-sensing unit.

Discussion of the Background

The present disclosure relates to a device for testing a display module, in particular to a device for testing a display module with a touch-sensing unit.

An organic light emitting display device includes an organic light emitting diode, which is used to display an image and is a self-luminous device, and due to its excellent brightness and color purity characteristics, it is emerging as a next-generation display device. The organic light emitting display device includes red, green, and blue pixels, which constitute a display panel and display a colorful image.

The organic light emitting display device includes a display module including the display panel, which is used to display an image, and a touch-sensing unit, which is configured to sense an external input and to output information on position or intensity of the external input. A process of fabricating the organic light emitting display device includes a step of testing whether the display module of the organic light emitting display device can be normally operated.

The above information disclosed in this Background section is only for understanding of the background of the inventive concepts, and, therefore, it may contain information that does not constitute prior art.

SUMMARY

An embodiment of the inventive concepts provides a testing device and a testing system, which can measure capacitance of a display panel in a step of testing a touch-sensing unit.

Additional features of the inventive concepts will be set forth in the description which follows, and in part will be apparent from the description, or may be learned by practice of the inventive concepts.

According to an exemplary embodiment of the inventive concepts, a testing device may include touch test pads electrically connected to touch pads of a display module, a first power test pad and a second power test pad electrically connected to a first power pad and a second power pad of the display module, a voltage generator providing a first test power voltage and a second power test voltage to the first power test pad and second power test pad, and a capacitance measurement circuit measuring capacitance between the first power test pad and second power test pad.

The voltage generator may change a voltage level of at least one of the first test power voltage and the second test power voltage, in response to a voltage control signal.

The testing device may further include a connector electrically connecting the touch pads to the touch test pads and electrically connecting the first and second power pads to the first and second power test pads and an interface outputting the voltage control signal in response to a test control signal received from an outside.

The capacitance measurement circuit may output a capacitance sensing signal corresponding to the measured capacitance.

The testing device may further include a touch tester outputting touch test signals to the touch test pads.

An operation of the touch tester outputting the touch test signals and an operation of the voltage generator outputting the first test power voltage and the second power test voltage may be executed in parallel.

The touch test pads, the first and second power test pads, the voltage generator, and the capacitance measurement circuit may be provided as a single integrated circuit.

The testing device may further include a panel testing circuit outputting panel test signals to signal pads of the display module.

The panel testing circuit may include touch test pads, which are electrically connected to the signal pads of the display module, and a test signal generator outputting the panel test signals to the touch test pads.

According to an exemplary embodiment of the inventive concepts, a testing system may include a display module and a testing device. The display module may include a display panel including a display region and a non-display region adjacent to the display region and a touch-sensing unit disposed on the display panel to sense an external input applied to a sensing region overlapped with the display region. The display panel may include touch pads disposed on the non-display region and electrically connected to the touch-sensing unit and a first power pad and a second power pad disposed on the non-display region and electrically connected to the display panel. The testing device may include touch test pads electrically connected to the touch pads, a first power test pad and a second power test pad electrically connected to the first power pad and the second power pad, a voltage generator providing a first test power voltage and a second power test voltage to the first power test pad and second power test pad, and a capacitance measurement circuit measuring capacitance between the first power test pad and second power test pad.

The voltage generator may change a voltage level of at least one of the first test power voltage and the second test power voltage, in response to a voltage control signal.

The testing system may further include a connector electrically connecting the touch pads to the touch test pads and electrically connecting the first and second power pads of the display panel to the first and second power test pads and an interface outputting the voltage control signal in response to a test control signal received from an outside.

The capacitance measurement circuit may output a capacitance sensing signal corresponding to the measured capacitance.

The testing system may further include a touch tester outputting touch test signals to the touch test pads.

The display panel may include a plurality of pixels, which are arranged in the display region and are connected to a plurality of data lines and a plurality of scan lines. At least one of the plurality of pixels may include a light-emitting diode including an anode and a cathode, a first transistor including a first electrode receiving a first power voltage, a second electrode electrically connected to the anode of the light-emitting diode, and a gate electrode, a capacitor including a first electrode connected to the first electrode of the first transistor and a second electrode connected to the gate electrode of the first transistor, and a second transistor including a first electrode connected to a corresponding one of the plurality of data lines, a second electrode connected to the second electrode of the capacitor, and a gate electrode receiving a first scan signal.

The first electrode of the first transistor may be electrically connected to the first power pad, and the cathode of the light-emitting diode may be electrically connected to the second power pad.

The capacitance measurement circuit may output a capacitance sensing signal corresponding to capacitance between the first electrode of the first transistor and the cathode of the light-emitting diode.

According to an exemplary embodiment of the inventive concepts, a testing method using a testing device is disclosed. The testing device may include touch test pads is electrically connected to touch pads of a touch-sensing unit and a first power test pad and a second power test pad electrically connected to a first power pad and a second power pad of a display panel. The method may include providing a first test power voltage and a second power test voltage to the first power test pad and the second power test pad and measuring capacitance between the first power test pad and second power test pad.

The method may further include outputting touch test signals to the touch test pads.

The method may further include outputting a capacitance sensing signal corresponding to the measured capacitance.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
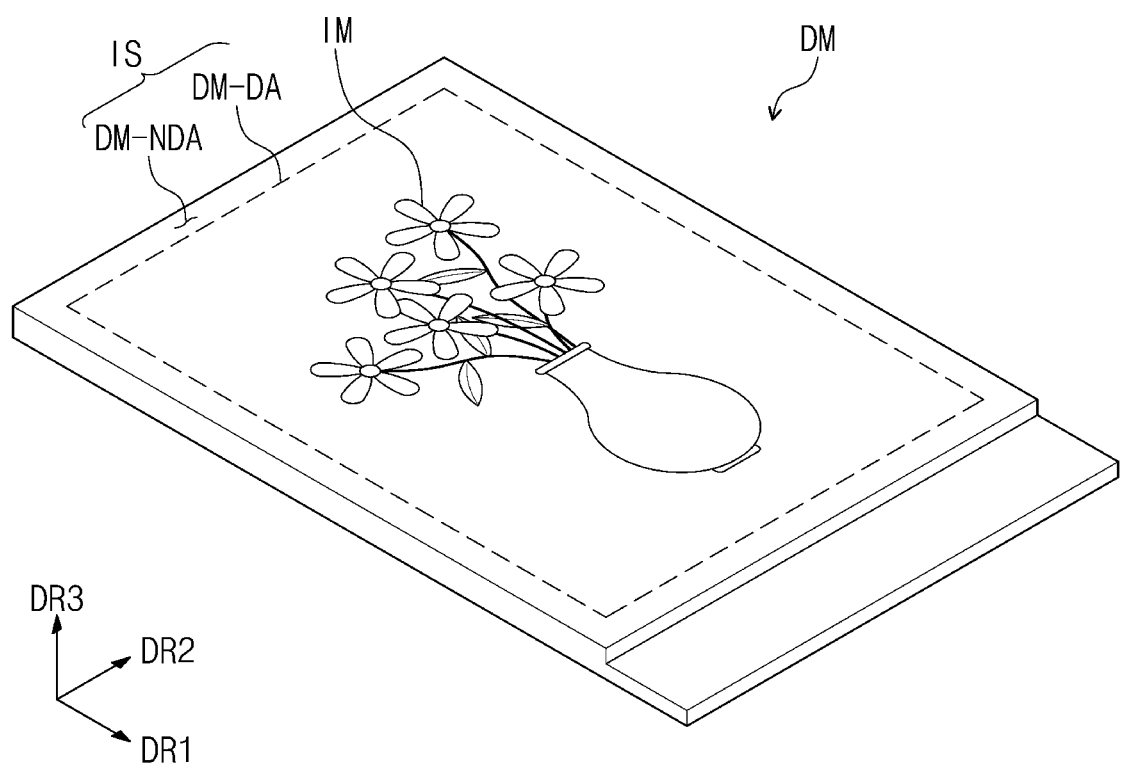
FIG. 1 is a perspective view illustrating a display module according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z—axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts.

Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
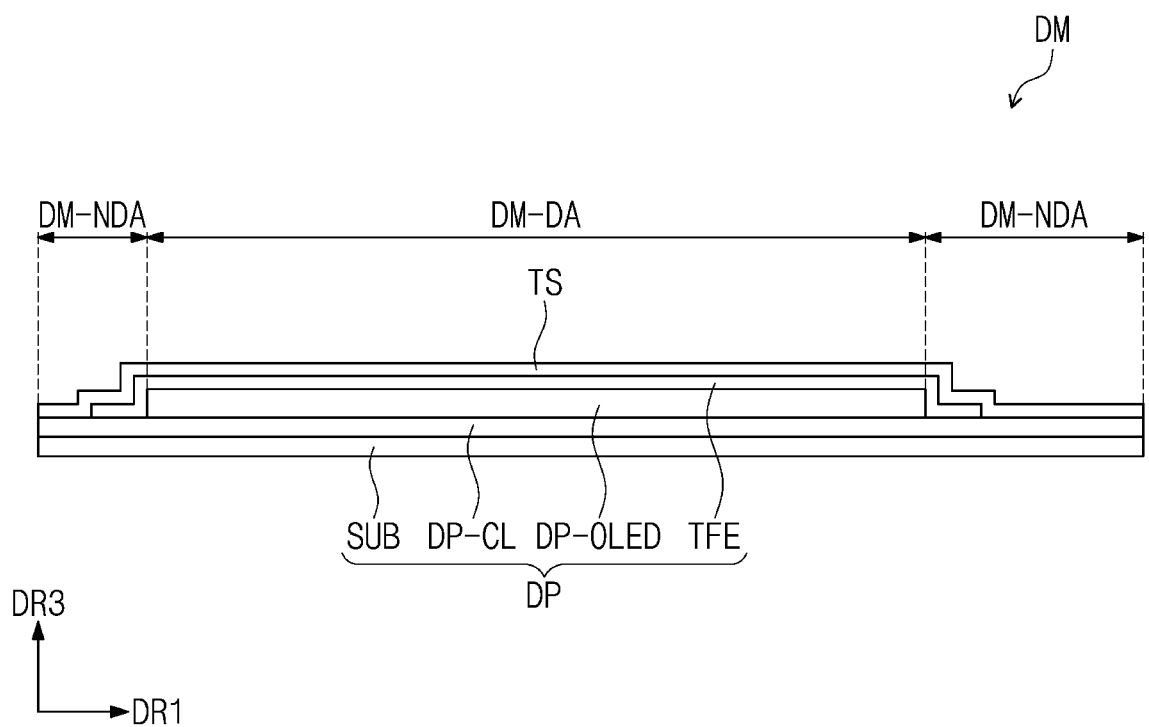
FIG. 2 is a sectional view illustrating a display module according to an exemplary embodiment.

FIG. 1 is a perspective view illustrating a display module according to an exemplary embodiment of the inventive concepts. FIG. 2 is a sectional view illustrating a display module according to an exemplary embodiment of the inventive concepts.

As shown in FIG. 1, a display surface IS, which is used to display an image IM, may be parallel to a plane defined by a first direction axis DR1 and a second direction axis DR2. A direction normal to the display surface IS (i.e., a thickness direction of a display module DM) will be referred to as a third direction axis DR3. The third direction axis DR3 may be used as a criterion for distinguishing a top or front surface from a bottom or rear surface of each element. However, directions indicated by the first to third direction axes DR1, DR2, and DR3 may be relative, and in an embodiment, they may be changed to indicate other directions. Hereinafter, first to third directions may be directions indicated by the first to third direction axes DR1, DR2, and DR3, respectively, and will be identified with the same reference numbers.

In the present exemplary embodiment, the display module DM may be a flat rigid display module. However, the inventive concepts are not limited to this example, and in an embodiment, the display module DM may be configured to have a flexible property. The display module DM according to the present embodiment may be used for large-sized electronic devices (e.g., television sets and monitors) or small- or medium-sized electronic devices (e.g., smart phones, tablets, car navigation systems, game machines, and smart watches).

As shown in FIG. 1, the display module DM may include a display region DM-DA, on which the image IM is displayed, and a non-display region DM-NDA, which is adjacent to the display region DM-DA. The non-display region DM-NDA may not be used to display an image. In FIG. 1, a vase with flowers therein are illustrated as an example of the image IM. The display region DM-DA may have a rectangular or tetragonal shape. The non-display region DM-NDA may enclose the display region DM-DA. However, the inventive concepts are not limited to this example, and the shapes of the display and non-display regions DM-DA and DM-NDA may be variously changed in a mutually influential manner.

FIG. 2 is a sectional view illustrating the display module DM according to an exemplary embodiment of the inventive concepts. FIG. 2 illustrates a vertical section of the display module DM, which is parallel to the first and third direction axes DR1 and DR3.

As shown in FIG. 2, the display module DM may include a display panel DP and a touch-sensing unit TS (or a touch-sensing layer). Although not shown, the display module DM may further include a protection member, which is disposed on a bottom surface of the display panel DP, and an anti-reflection member and/or a window member, which are disposed on a top surface of the touch-sensing unit TS.

The display panel DP may be a light-emitting type display panel, but the inventive concepts are not limited to this example. For example, the display panel DP may be an organic light emitting display panel or a quantum dot light-emitting display panel. For the organic light emitting display panel, a light emitting layer may include an organic light emitting material. For the quantum dot light-emitting display panel, a light emitting layer may include quantum dots and quantum rods. For the sake of simplicity, the description that follows will refer to an example in which the display panel DP is the organic light emitting display panel.

The display panel DP may include a base layer SUB and a circuit device layer DP-CL, a display element layer DP-OLED, and a thin encapsulation layer TFE, which are disposed on the base layer SUB. Although not shown, the display panel DP may further include functional layers, such as an anti-reflection layer and a refractive index controlling layer.

The base layer SUB may include at least one plastic film. The base layer SUB may be a flexible substrate and may include at least one of a plastic substrate, a glass substrate, a metal substrate, or a substrate made of an organic/inorganic composite material. The display region DM-DA and the non-display region DM-NDA described with reference to FIG. 1 may be defined in the base layer SUB in the same manner.

The circuit device layer DP-CL may include at least one intermediate insulating layer and a circuit device. The intermediate insulating layer may include at least one intermediate inorganic layer and at least one intermediate organic layer. The circuit device may include signal lines, a pixel driving circuit, and so forth. This will be described in more detail below.

The display element layer DP-OLED may include at least organic light emitting diodes. The display element layer DP-OLED may further include an organic layer such as a pixel definition layer.

The thin encapsulation layer TFE may seal or encapsulate the display element layer DP-OLED. The thin encapsulation layer TFE may include at least one inorganic layer (hereinafter, an inorganic encapsulation layer). The thin encapsulation layer TFE may further include at least one organic layer (hereinafter, an organic encapsulation layer). The inorganic encapsulation layer may protect the display element layer DP-OLED from moisture or oxygen, and the organic encapsulation layer may protect the display element layer DP-OLED from a contamination material such as dust particles. The inorganic encapsulation layer may be formed of or include at least one of silicon nitride, silicon oxynitride, silicon oxide, titanium oxide, or aluminum oxide. The organic encapsulation layer may be formed of or include at least one of acrylic-based organic materials, but the inventive concepts are not limited thereto.

The touch-sensing unit TS may be configured to obtain information on coordinates of an external input. The touch-sensing unit TS may be directly disposed on the display panel DP. In the present specification, the expression "be directly provided" is used to represent that one layer are successively formed on the other layer, without formation of an additional adhesive layer.

The touch-sensing unit TS may have a multi-layered structure. The touch-sensing unit TS may include one or more conductive layers. The touch-sensing unit TS may include one or more insulating layers.

The touch-sensing unit TS may sense an external input in a capacitance sensing manner. The inventive concepts are not limited to a specific sensing method of the touch-sensing unit TS, and in an exemplary embodiment, the touch-sensing unit TS may sense an external input in an electromagnetic induction manner or a pressure-sensing manner.

Figure 3:
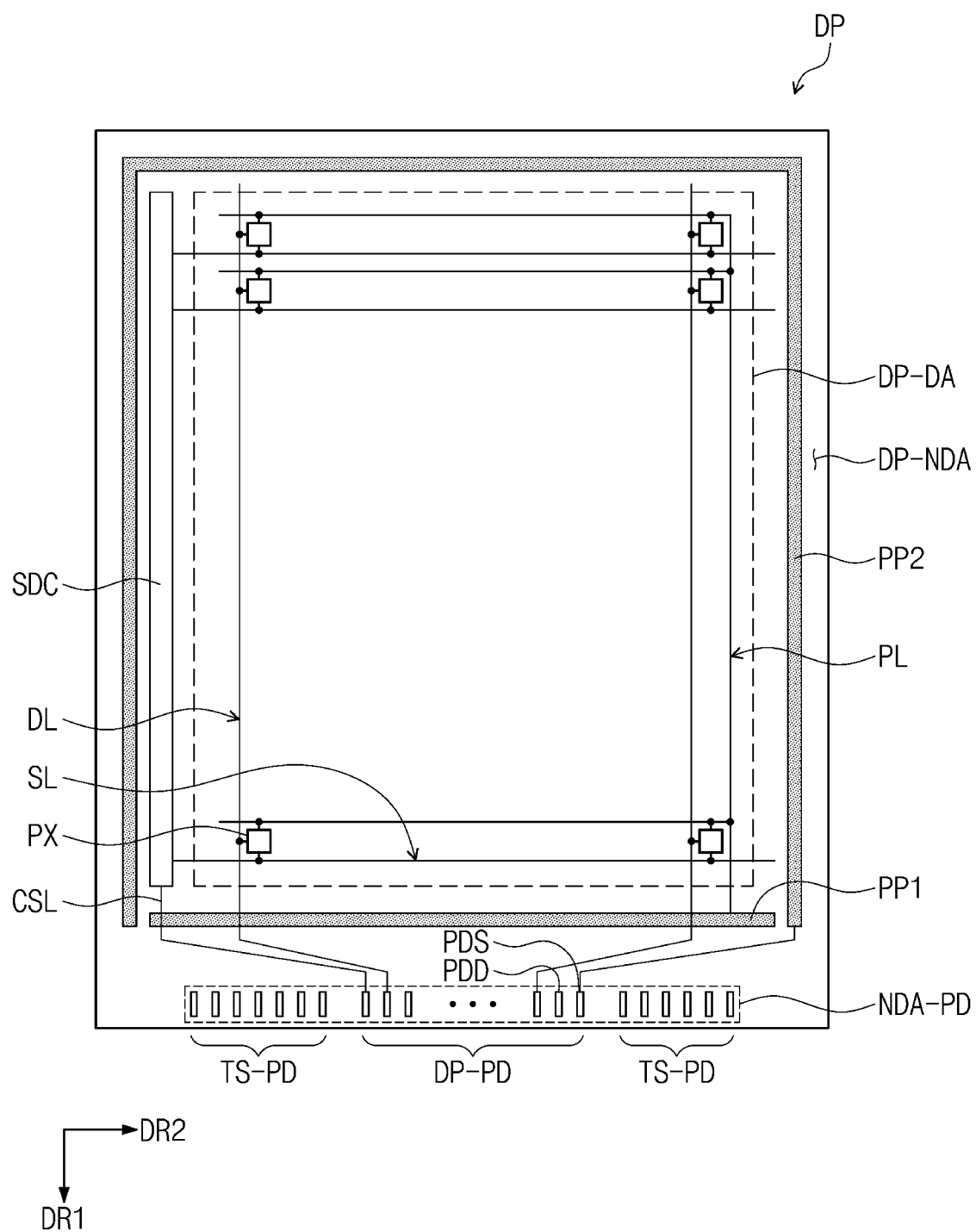
FIG. 3 is a plan view illustrating a display panel according to an exemplary embodiment.

FIG. 3 is a plan view illustrating a display panel according to an exemplary embodiment of the inventive concepts.

As shown in FIG. 3, the display panel DP may include a display region DP-DA and a non-display region DP-NDA, when viewed in a plan view. In the present embodiment, the non-display region DP-NDA may be defined along a border of the display region DP-DA. The display region DP-DA and the non-display region DP-NDA of the display panel DP may correspond to the display region DM-DA and the non-display region DM-NDA, respectively, of the display module DM shown in FIG. 1. The display region DP-DA and the non-display region DP-NDA of the display panel DP may not be the same as the display region DM-DA and the non-display region DM-NDA of the display module DM and may be changed according to the structure or design of the display panel DP.

The display panel DP may include a scan driving circuit SDC, a plurality of signal lines DL, CSL, SL, and PL, and a plurality of pixels PX. The pixels PX may be disposed in the display region DP-DA. Each of the pixels PX may include an organic light emitting diode and a pixel driving circuit connected thereto. The scan driving circuit SDC, the signal lines DL, CSL, SL, and PL, and the pixel driving circuit may be included in the circuit device layer DP-CL of FIG. 2.

The scan driving circuit SDC may generate a plurality of scan signals and may sequentially output the plurality of scan signals to a plurality of scan lines SL to be described below. The scan driving circuit SDC may further output other control signals to the pixel driving circuit of the pixels PX.

The scan driving circuit SDC may include a plurality of thin film transistors that are formed by the same process as that for the pixel driving circuit of the pixels PX (e.g., by a low temperature polycrystalline silicon (LTPS) process or a low temperature polycrystalline oxide (LTPO) process).

Each of the scan lines SL may be connected to corresponding ones of the plurality of the pixels PX, and each of the data lines DL may be connected to corresponding ones of the plurality of the pixels PX. The power line PL may be connected to the plurality of pixels PX. The control signal line CSL may provide control signals to the scan driving circuit SDC.

The display panel DP may include signal pads DP-PD, which are respectively connected to ends of the signal lines SL. In an embodiment, each of the signal pads DP-PD may be a kind of circuit device. A portion of the non-display region DP-NDA, on which the signal pads DP-PD are disposed, may be defined as a pad region NDA-PD. Touch pads TS-PD, which are connected to touch signal lines to be described below, may be disposed on the pad region NDA-PD.

A first power pattern PP1 and a second power pattern PP2 may be disposed in the non-display region DP-NDA. The first power pattern PP1 may extend in the second direction axis DR2. The second power pattern PP2 may have a rectangular shape having a first side extending in the first direction axis DR1 and a second side extending in the second direction axis DR2. The first power pattern PP1 and the second power pattern PP2 may be spaced apart from each other, when viewed in a plan view. The shapes and arrangement of the first power pattern PP1 and the second power pattern PP2 may be variously changed from those in FIG. 5.

The first power pattern PP1 may be electrically connected to a first power pad PDD of the signal pads DP-PD, and the second power pattern PP2 may be electrically connected to a second power pad PDS of the signal pads DP-PD. In this embodiment, each of the first power pattern PP1 and the second power pattern PP2 may be connected to a single pad, but the inventive concepts are not limited to this example. For example, each of the first power pattern PP1 and the second power pattern PP2 may be electrically connected to two or more pads.

Figure 4:
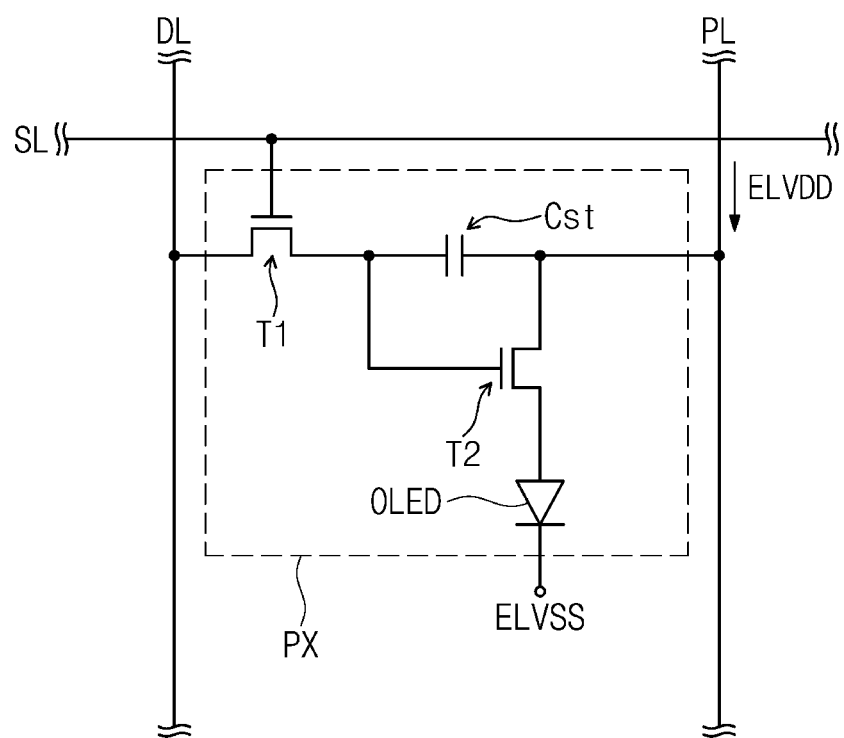
FIG. 4 is an equivalent circuit diagram illustrating a pixel according to an exemplary embodiment.

FIG. 4 is an equivalent circuit diagram illustrating a pixel according to an exemplary embodiment of the inventive concepts.

FIG. 4 exemplarily illustrates one of the pixels PX that is connected to one of the scan line SL, one of the data lines DL, and the power line PL. The structure of the pixel PX is not limited to this example and may take other forms.

The organic light emitting diode OLED may be a top-emission type diode or a bottom-emission type diode. The pixel PX may include a first or switching transistor T1, a second or driving transistor T2, and a capacitor Cst, which are used as a pixel driving circuit for driving the organic light emitting diode OLED. A first power voltage ELVDD may be provided to the second transistor T2, and a second power voltage ELVSS may be provided to the organic light emitting diode OLED. The second power voltage ELVSS may be lower than the first power voltage ELVDD.

The first power voltage ELVDD may be received through the first power pad PDD and the first power pattern PP1 shown in FIG. 3. The second power voltage ELVSS may be received through the second power pad PDS and the second power pattern PP2 shown in FIG. 3.

If a scan signal is applied to a scan line GL, the first transistor T1 may output a data signal applied to the data line DL in response to the scan signal. The capacitor Cst may be charged to have a voltage corresponding to the data signal, which is transmitted from the first transistor T1.

The second transistor T2 may be connected to the organic light emitting diode OLED. The second transistor T2 may control a driving current flowing through the organic light emitting diode OLED in accordance with an amount of charges stored in the capacitor Cst. The organic light emitting diode OLED may emit light, when the second transistor T2 is in a turn-on period.

Figure 5:
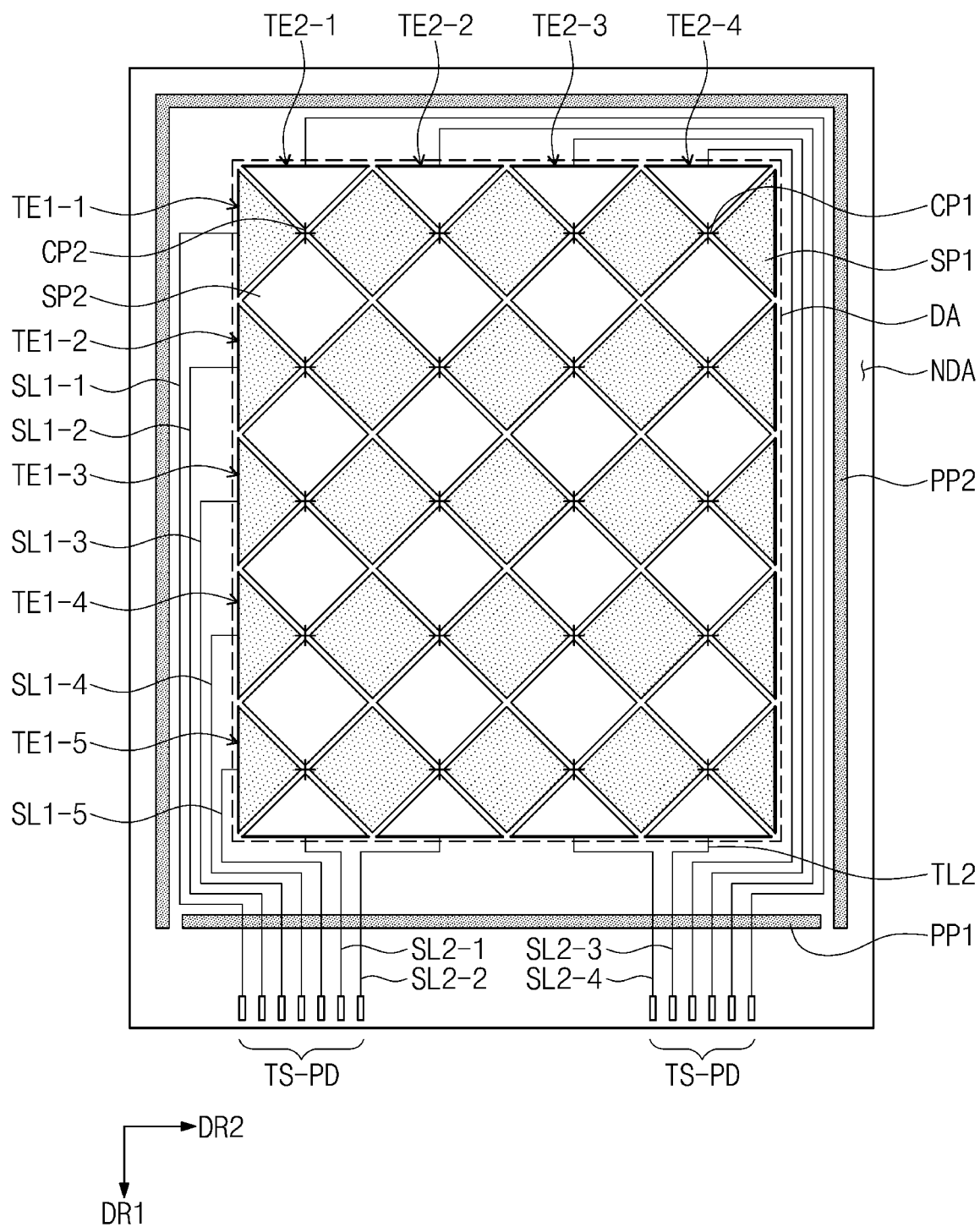
FIG. 5 is a plan view illustrating a touch-sensing unit according to an exemplary embodiment.

FIG. 5 is a plan view illustrating a touch-sensing unit according to an exemplary embodiment of the inventive concepts.

In FIG. 5, the first power pattern PP1 and the second power pattern PP2, which are disposed in the display panel DP, are illustrated to clearly show positions thereof relative to the touch-sensing unit TS. In the present embodiment, first touch signal lines SL1-1 to SL1-5 and second touch signal lines SL2-1 to SL2-4 are illustrated to be connected to ends of first touch electrodes TE1-1 to TE1-5 and second touch electrodes TE2-1 to TE2-4, but in an embodiment, more signal lines may be disposed. For example, third touch signal lines, connected to opposite ends of the second touch electrodes TE2-1 to TE2-4, may be further disposed. Touch pads, which are connected to the third touch signal lines, may also be disposed side by side beside the touch pads TS-PD shown in FIG. 5. In addition, the arrangement of the first touch signal lines SL1-1 to SL1-5 and the second touch signal lines SL2-1 to SL2-4 may also be changed. Each of the first touch electrodes TE1-1 to TE1-5 may have a mesh shape, in which a plurality of touch openings are defined. Each of the first touch electrodes TE1-1 to TE1-5 may include a plurality of first touch sensor units SP1 and a plurality of first connecting portions CP1. The first touch sensor units SP1 may be arranged along the second direction axis DR2. Each of the first connecting portions CP1 may connect two adjacent ones of the first touch sensor units SP1 to each other. Although not shown in detail, the first touch signal lines SL1-1 to SL1-5 may have a mesh shape.

The second touch electrodes TE2-1 to TE2-4 may cross the first touch electrodes TE1-1 to TE1-5 in an electrically disconnected manner. Each of the second touch electrodes TE2-1 to TE2-4 may have a mesh shape, in which a plurality of touch openings are defined. Each of the second touch electrodes TE2-1 to TE2-4 may include a plurality of second touch sensor units SP2 and a plurality of second connecting portions CP2. The second touch sensor units SP2 may be arranged along the first direction axis DR1. Each of the second connecting portions CP2 may connect two adjacent ones of the second touch sensor units SP2 to each other. The second touch signal lines SL2-1 to SL2-4 may also have a mesh shape.

The first touch electrodes TE1-1 to TE1-5 may be capacitively coupled with the second touch electrodes TE2-1 to TE2-4. Touch sensing signals applied to the first touch electrodes TE1-1 to TE1-5 may change the capacitance between the first touch sensor units SP1 and the second touch sensor units SP2.

FIG. 5 illustrates an example of the touch-sensing unit TS, in which the first connecting portions CP1 and the second connecting portions CP2 are disposed to cross each other, but the inventive concepts are not limited to this example. For example, to prevent the second connecting portions CP2 from being overlapped with the first connecting portions CP1, a shape of each of the second connecting portions CP2 may be changed to have a V shaped structure. In an embodiment, even if the second connecting portions CP2 have the V-shaped structure, the second connecting portions CP2 may be overlapped with the first touch sensor units SP1. In the present embodiment, the first touch sensor units SP1 and the second touch sensor units SP2 are illustrated to have a diamond or triangular shape, but the inventive concepts are not limited to these examples.

As shown in FIG. 5, the touch-sensing unit TS may be a single-layered touch-sensing unit including a conductive layer TS-CL and a touch insulating layer TS-IL. The single-layered touch-sensing unit may obtain coordinate information in a self-capacitance manner.

Figure 6:
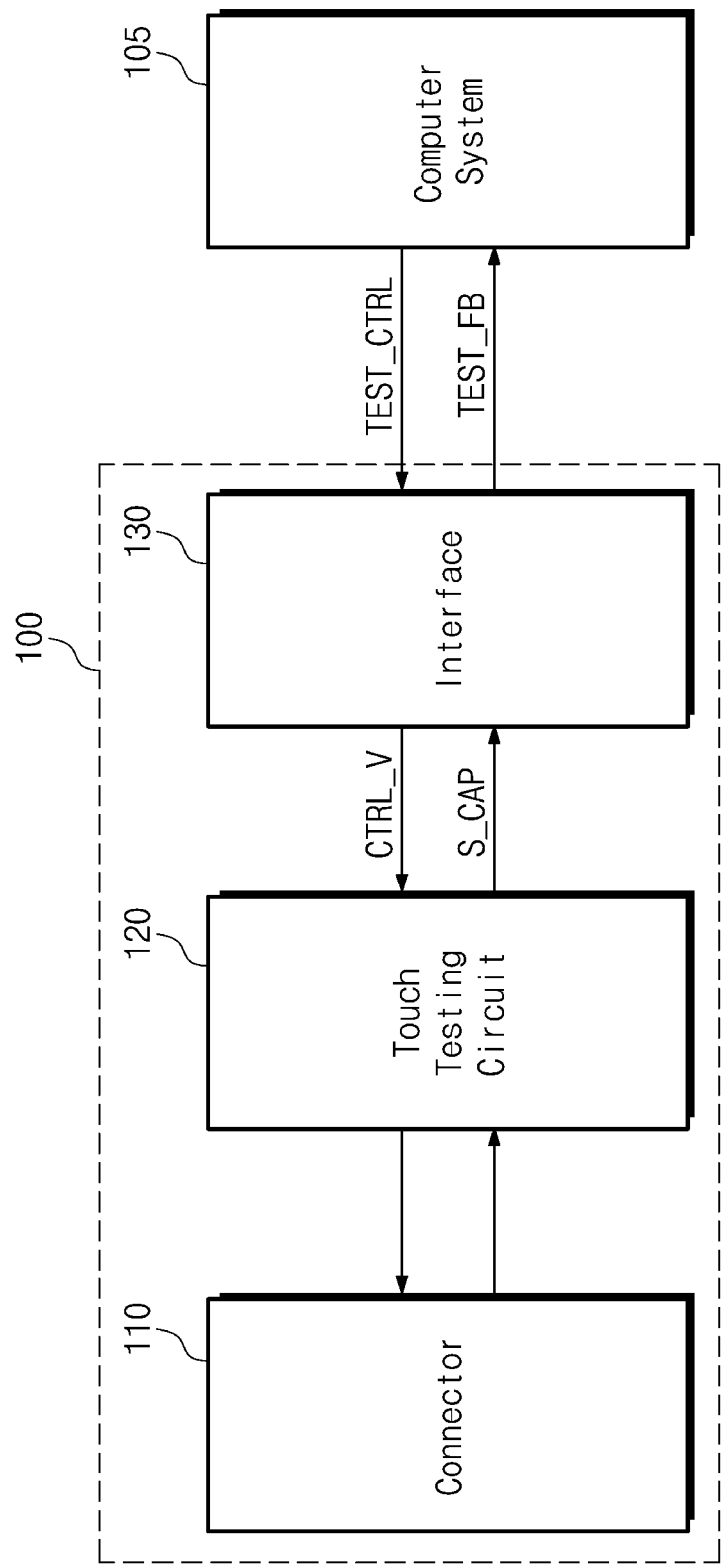
FIG. 6 is a block diagram illustrating a touch testing device according to an exemplary embodiment.

FIG. 6 is a block diagram illustrating a touch testing device according to an exemplary embodiment of the inventive concepts.

Referring to FIG. 6, a touch testing device 100 may be used to test operations of the touch-sensing unit TS shown in FIG. 5. The touch testing device 100 may test the touch-sensing unit TS, in response to a test control signal TEST_CTRL from an external host (e.g., a computer system 105), and may provide a test feed-back signal TEST_FB to the computer system 105.

In an exemplary embodiment of the inventive concepts, the touch testing device 100 may measure capacitance between the first power pad PDD and the second power pad PDS of the display panel DP shown in FIG. 3 and may output information on the measured capacitance as the test feed-back signal TEST_FB.

A connector 110 may be electrically connected to some (e.g., the first power pad PDD and the second power pad PDS) of the touch pads TS-PD and the signal pads DP-PD shown in FIG. 3.

The touch testing device 100 may include the connector 110, a touch testing circuit 120, and an interface 130. The interface 130 may provide a voltage control signal CTRL_V, which is used to test the display panel DP, to the touch testing circuit 120, in response to the test control signal TEST CTRL from the computer system 105.

The touch testing circuit 120 may sense capacitance of the display panel DP through the connector 110, in response to the voltage control signal CTRL_V, and may output a capacitance sensing signal S_CAP, which correspond to the sensed capacitance, to the interface 130. The interface 130 may provide the capacitance sensing signal S_CAP, which serves as the test feed-back signal TEST_FB, to the computer system 105.

In an exemplary embodiment, the touch testing circuit 120 may be realized in the form of a single integrated circuit.

In an exemplary embodiment, the connector 110 may be provided on a pin board for testing the display module DM of FIG. 1. In an embodiment, the connector 110 may include pads on a flexible printed circuit board (FPCB), and the touch testing circuit 120 may be mounted on the FPCB. The connector 110 may be used to connect the display module DM shown in FIG. 1 to the touch testing circuit 120, as described above, but the inventive concepts are not limited to such a connection structure. The structure for connecting the display module DM to the touch testing circuit 120 (e.g., using the connector 110) may be variously changed.

Figure 7:
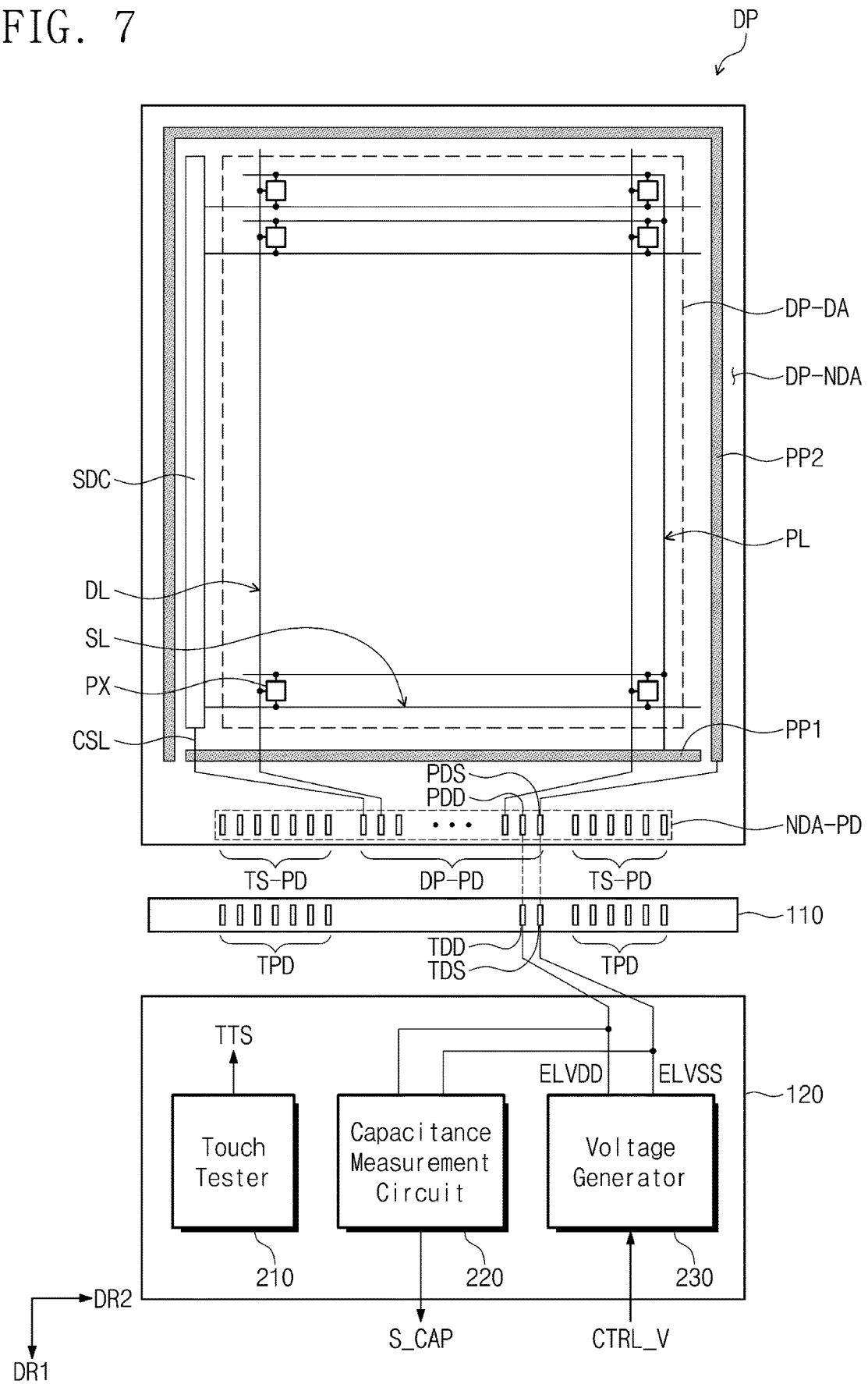
FIG. 7 is a block diagram illustrating an example connection structure between a display panel and a touch testing device shown in FIG. 3.

FIG. 7 is a block diagram illustrating an example connection structure between a display panel and a touch testing device shown in FIG. 3.

Referring to FIG. 7, the connector 110 may include touch test pads TPD, which are connected to the touch pads TS-PD of the display panel DP, and a first power test pad TDD and a second power test pad TDS, which are electrically connected to the first power pad PDD and the second power pad PDS of the display panel DP.

The touch testing circuit 120 may include a touch tester 210, a capacitance measurement circuit 220, and a voltage generator 230. The touch tester 210 may generate a touch test signal TTS for testing the touch-sensing unit TS shown in FIG. 5. The touch test signal TTS may be provided to the touch pads TS-PD of the display panel DP through the touch test pads TPD. Since the touch pads TS-PD are connected to the first touch signal lines SL1-1 to SL1-5 and the second touch signal lines SL2-1 to SL2-4 of FIG. 5, the touch-sensing unit TS may be tested using the touch test signal TTS.

The voltage generator 230 may generate the first power voltage ELVDD and the second power voltage ELVSS. In this embodiment, the voltage generator 230 is described to generate only two voltages ELVDD and ELVSS, but the inventive concepts are not limited to this example. For example, the voltage generator 230 may generate various voltages required to test the touch-sensing unit TS of FIG. 5. The voltage generator 230 may control a voltage level of each of the first power voltage ELVDD and the second power voltage ELVSS, in response to the voltage control signal CTRL_V.

The first power voltage ELVDD and the second power voltage ELVSS generated by the voltage generator 230 may be provided to the first power pad PDD the second power pad PDS, respectively, through the first power test pad TDD and the second power test pad TDS. When the touch tester 210 outputs the touch test signal TTS, the voltage generator 230 outputs the first power voltage ELVDD and the second power voltage ELVSS. At this time, the first power voltage ELVDD and the second power voltage ELVSS may be correspond to a first test power voltage and a second power test voltage, respectively.

The capacitance measurement circuit 220 may measure capacitance between the first power test pad TDD and the second power test pad TDS. The capacitance measurement circuit 220 may output the capacitance sensing signal S_CAP corresponding to the measured capacitance.

In exemplary embodiments, the capacitance measurement circuit 220 may be used to measure the capacitance between the first power test pad TDD and the second power test pad TDS, but the inventive concepts are not limited to this example. The capacitance measurement circuit 220 may be a device, which is provided to test characteristics of the touch-sensing unit TS. In this case, since the capacitance of the display panel DP is measured using the capacitance measurement circuit 220, which is provided to test the characteristics of the touch-sensing unit TS, it is unnecessary to provide an specific-purpose capacitance measurement circuit for measuring the capacitance of the display panel DP.

Referring to FIGS. 4 and 7, the first power voltage ELVDD may be transferred to the second transistor T2 through the power line PL, and the second power voltage ELVSS may be transferred to a cathode terminal of the organic light emitting diode OLED.

Electrostatic capacitance between anode and cathode terminals of the organic light emitting diode OLED may be measured to examine whether the organic light emitting diode OLED is deteriorated. The anode terminal of the organic light emitting diode OLED may be supplied with the first power voltage ELVDD through the second transistor T2, and the cathode terminal of the organic light emitting diode OLED may be supplied with the second power voltage ELVSS. By measuring the capacitance between the first power pad PDD and the second power pad PDS using the first power voltage ELVDD and the second power voltage ELVSS, it may be possible to determine whether the organic light emitting diode OLED is deteriorated.

Figure 8A:
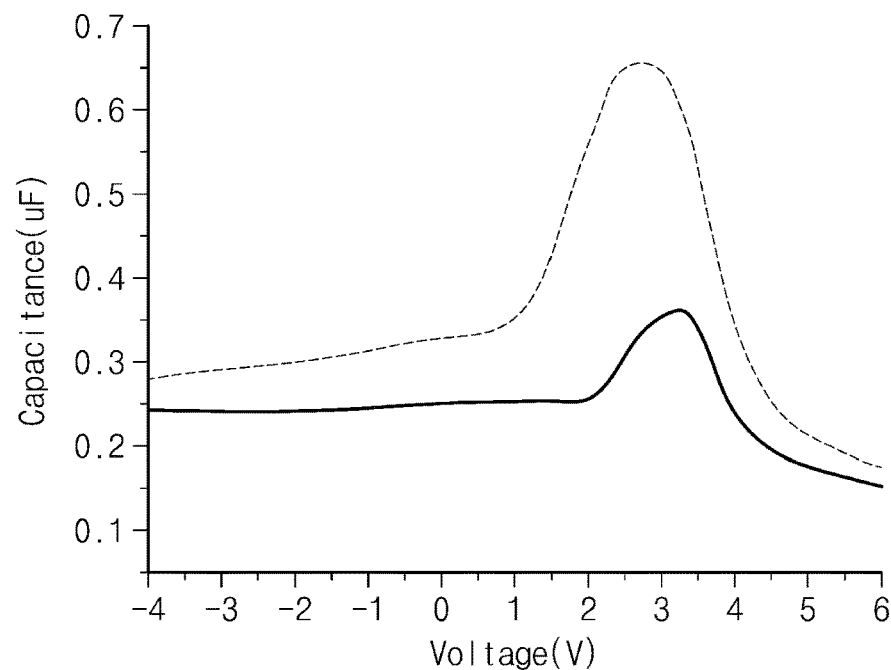
FIGS. 8A, 8B, and 8C are graphs each showing a change in capacitance caused by a difference in voltage between a first power pad and a second power pad shown in FIG. 7.
Figure 8B:
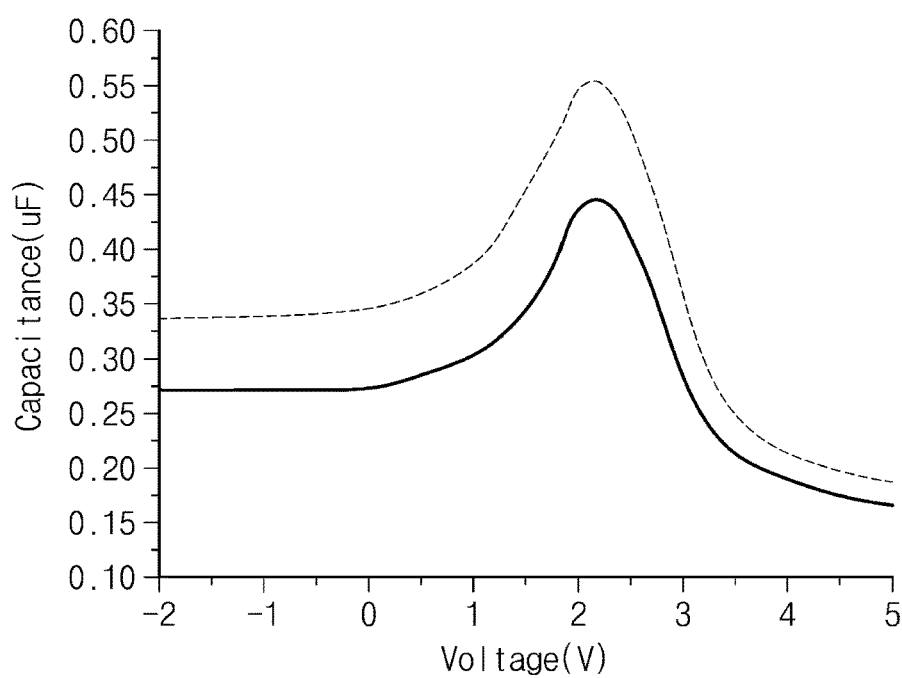
Figure 8C:
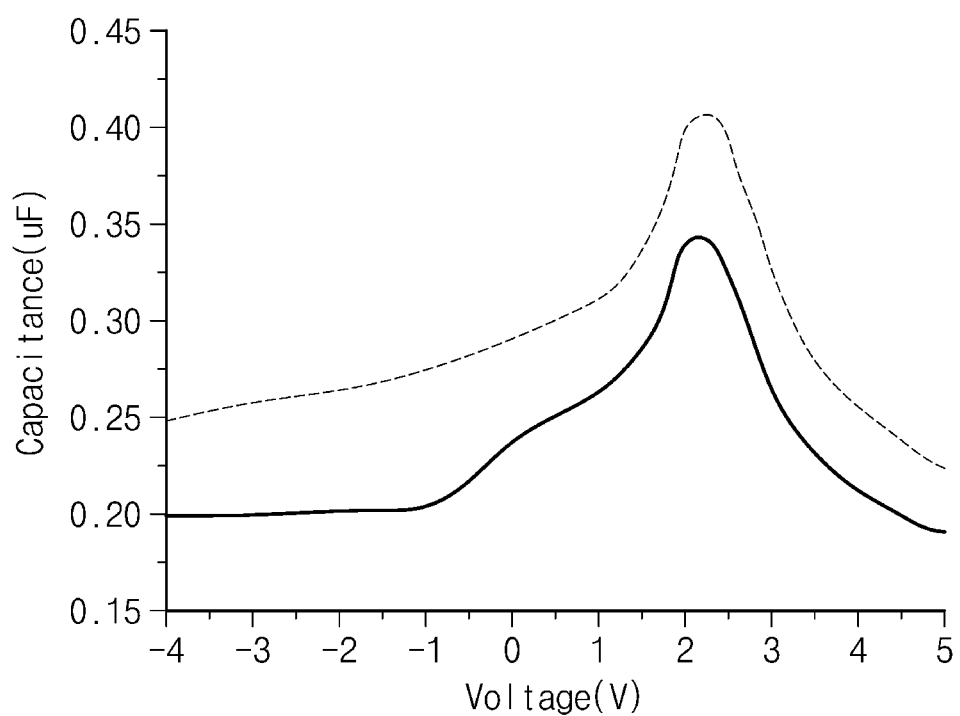

FIGS. 8A, 8B, and 8C are graphs each showing a change in capacitance caused by a difference in voltage between a first power pad and a second power pad shown in FIG. 7. In FIGS. 8A to 8C, the solid line represents the capacitance in a normal state, and the dotted line represents the capacitance in an abnormal state.

FIG. 8A shows a capacitance characteristics of a blue color organic light emitting diode, FIG. 8B shows a capacitance characteristics of a green color organic light emitting diode, and FIG. 8C shows a capacitance characteristics of a red color organic light emitting diode.

As shown in FIGS. 8A to 8C, the capacitance characteristics of the organic light emitting diode may vary depending on a difference between the first power voltage ELVDD and the second power voltage ELVSS, which are provided to the first power test pad TDD and the second power test pad TDS.

Furthermore, the capacitance characteristics of the organic light emitting diode may vary depending on whether the organic light emitting diode is in a normal state or in an abnormal (e.g., deteriorated) state. As shown in FIGS. 8A to 8C, all of the blue, green, and red organic light emitting diodes have higher capacitance in the abnormal state than in the normal state.

The voltage generator 230 shown in FIG. 7 may control a voltage level of each of the first power voltage ELVDD and the second power voltage ELVSS, in response to the voltage control signal CTRL_V. For example, the voltage generator 230 may fix a voltage level of one of the first power voltage ELVDD and the second power voltage ELVSS and may change a voltage level of the other. In an embodiment, the voltage generator 230 may change the first power voltage ELVDD and the second power voltage ELVSS at the same time. For example, the first power voltage ELVDD and the second power voltage ELVSS may be changed to have a voltage difference ranging from −5V to 6V, as shown in FIGS. 8A to 8C.

The capacitance measurement circuit 220 may measure capacitance between the first power test pad TDD and the second power test pad TDS. The capacitance measurement circuit 220 may output the capacitance sensing signal S_CAP corresponding to the measured capacitance.

The capacitance of the organic light emitting diode OLED of the display panel DP may be tested by using the capacitance measurement circuit 220, which is prepared for the touch-sensing unit TS. Thus, it is unnecessary to provide an additional capacitance measurement circuit for measuring only the capacitance of the display panel DP.

Figure 9:
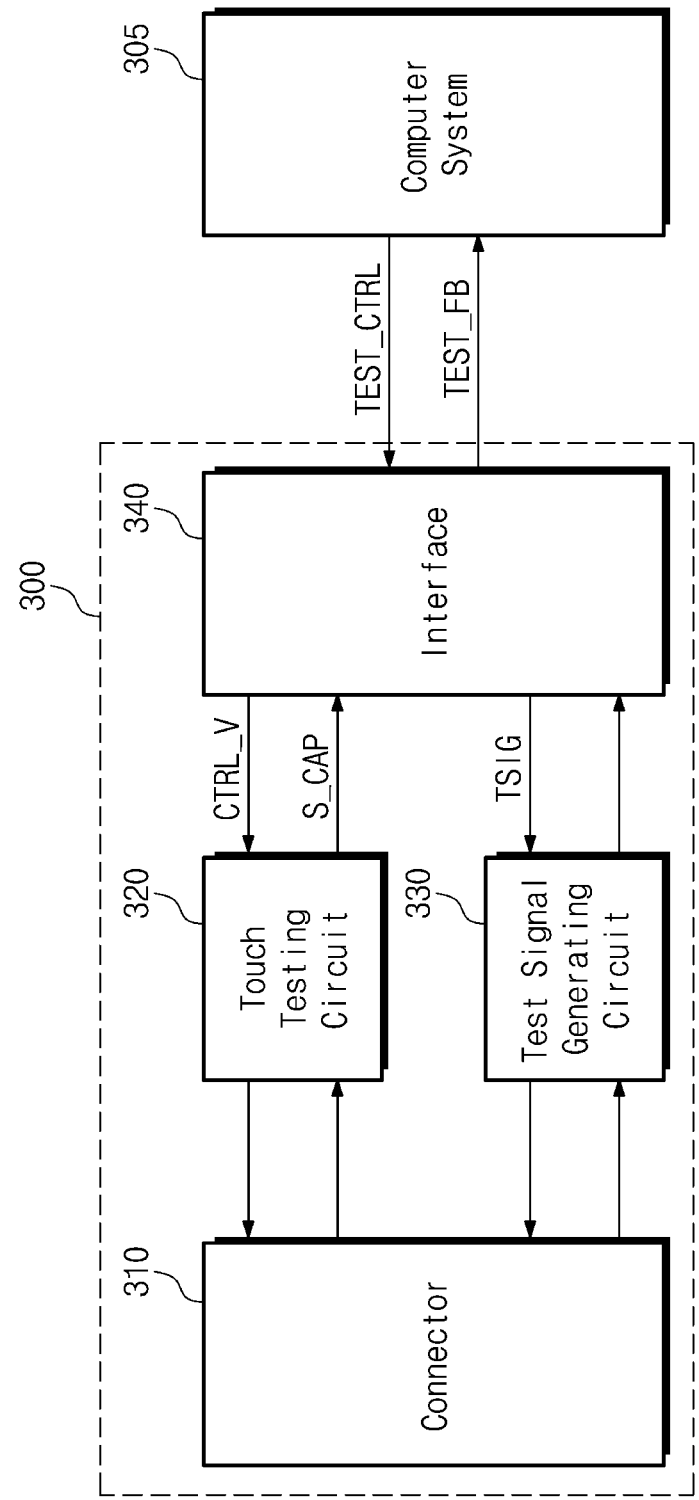
FIG. 9 is a block diagram illustrating a touch testing device according to another exemplary embodiment.
Figure 10:
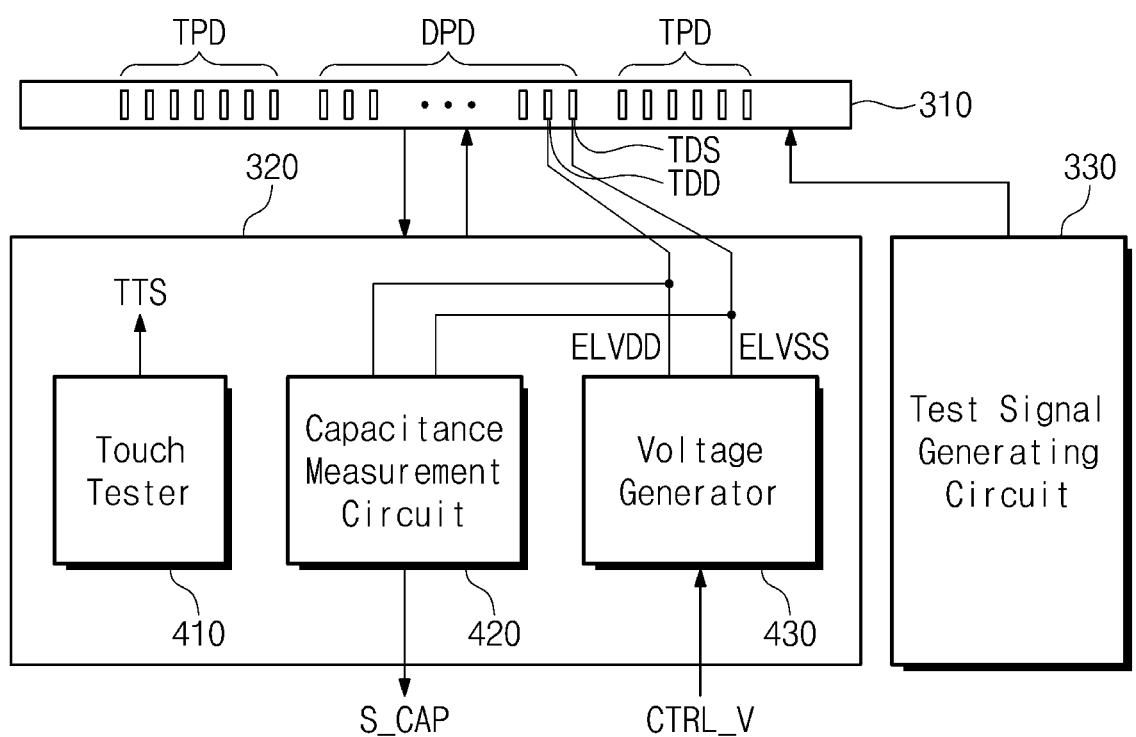
FIG. 10 is a diagram showing an example of a structure of a touch testing circuit of FIG. 9.

FIG. 9 is a block diagram illustrating a touch testing device according to another exemplary embodiment of the inventive concepts. FIG. 10 is a diagram showing an example of a structure of a touch testing circuit of FIG. 9.

As shown in FIG. 9, a touch testing device 300 may test the touch-sensing unit TS, in response to a test control signal TEST_CTRL from an external host (e.g., a computer system 305), and may provide a test feed-back signal TEST_FB to the computer system 305. The touch testing device 300 may include the connector 310, a touch testing circuit 320, a test signal generating circuit 330, and an interface 340. In the embodiment shown in FIG. 9, the touch testing circuit 320 and an interface 340 may have the same circuit structure and operation as the touch testing circuit 120 and the interface 130 described with reference to FIG. 6.

Referring to FIGS. 9 and 10, the connector 310 may include the touch test pads TPD and display panel test pads DPD, which may be electrically connected to the touch pads TS-PD and the signal pads DP-PD shown in FIG. 3. The display panel test pads DPD may include the first power test pad TDD and the second power test pad TDS.

A voltage generator 430 may generate the first power voltage ELVDD and the second power voltage ELVSS, in response to the voltage control signal CTRL_V. The first power voltage ELVDD and the second power voltage ELVSS may be provided to the first power test pad TDD and the second power test pad TDS, respectively.

The touch tester 410 may generate a touch test signal TTS for testing the touch-sensing unit TS shown in FIG. 5. A capacitance measurement circuit 420 may measure capacitance between the first power test pad TDD and the second power test pad TDS. The capacitance measurement circuit 420 may output the capacitance sensing signal S_CAP corresponding to the measured capacitance.

The test signal generating circuit 330 may generate test signals to be provided to the display panel test pads DPD, in response to the test signal TSIG from the interface 340. For example, the test signals may include clock signals, which will be provided to the scan driving circuit SDC of the display panel DP shown in FIG. 3, and data signals, which will be provided to the data lines DL.

The test signal generating circuit 330 of the touch testing device 300 may provide the clock and data signals to the display panel DP, and the voltage generator 430 may provide the first power voltage ELVDD and the second power voltage ELVSS to the display panel DP.

Thus, the capacitance measurement circuit 420 may measure capacitance between the first power test pad TDD and the second power test pad TDS, when operations of the display panel DP are executed in response to the first power voltage ELVDD, the second power voltage ELVSS, the clock signals, and the data signal.

Figure 11:
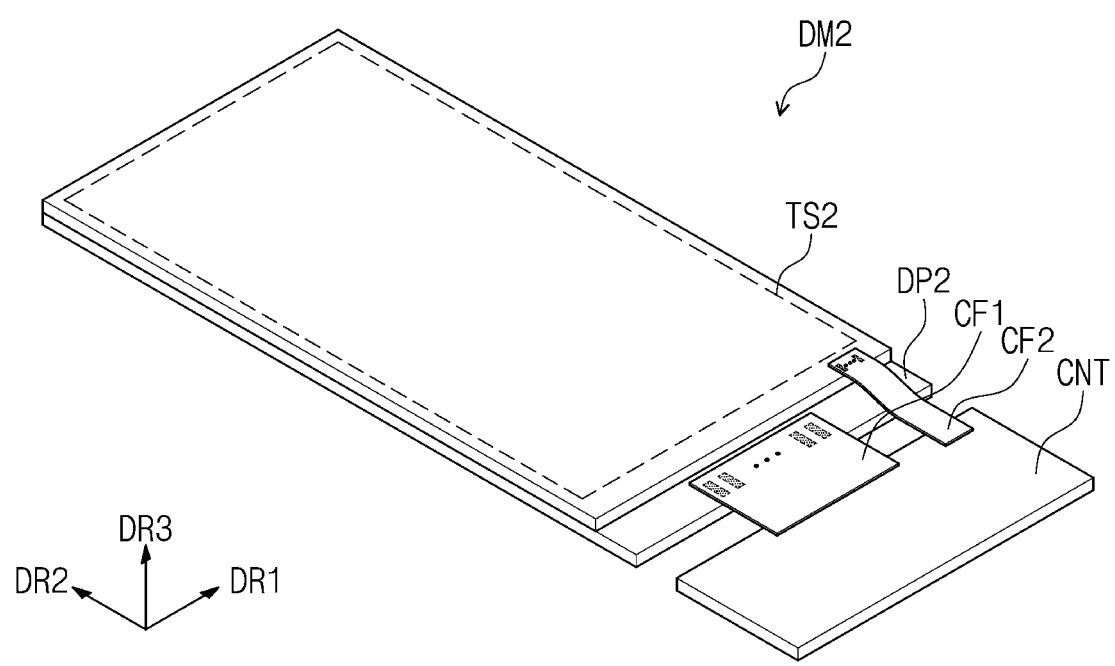
FIG. 11 is a perspective view illustrating a display module according to another exemplary embodiment.

FIG. 11 is a perspective view illustrating a display module according to another exemplary embodiment of the inventive concepts.

Referring to FIG. 11, a display module DM2 may include a display panel DP2, a touch-sensing unit TS2 (or a touch-sensing layer), a first circuit substrate CF1, a second circuit substrate CF2, and a connector CNT.

The first circuit substrate CF1 may be electrically connected to the display panel DP2. The first circuit substrate CF1 may connect the display panel DP2 to the connector CNT. In the present embodiment, the first circuit substrate CF1 may be a flexible circuit film. However, the inventive concepts are not limited to this example, and in an embodiment, the first circuit substrate CF1 may be a rigid substrate.

The second circuit substrate CF2 may be electrically connected to the touch-sensing unit TS2. The second circuit substrate CF2 may connect the touch-sensing unit TS2 to the connector CNT. In the present embodiment, the second circuit substrate CF2 may be a flexible circuit film, but the inventive concepts are not limited to this example. For example, the second circuit substrate CF2 may be a rigid substrate.

Figure 12:
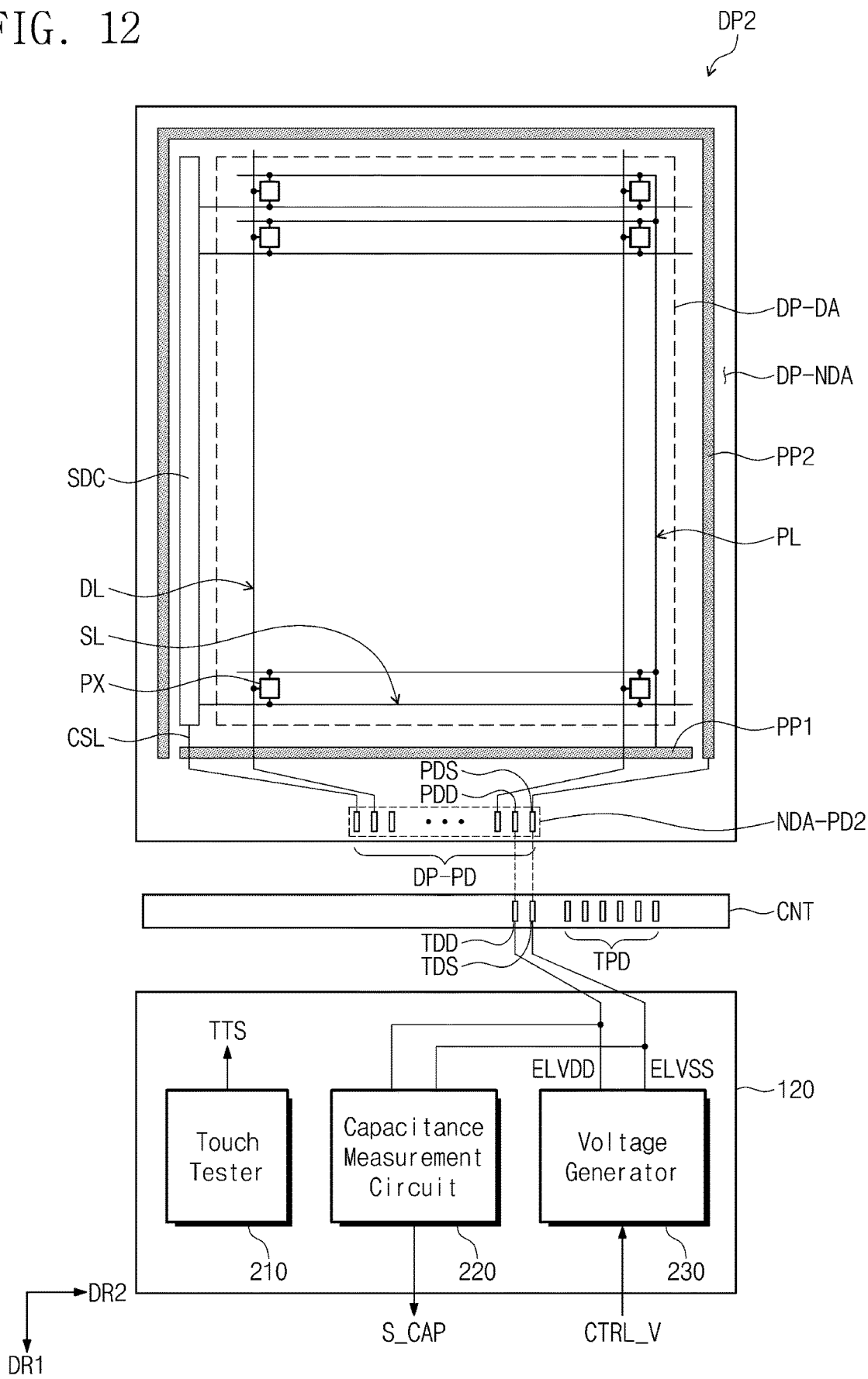
FIG. 12 is a diagram illustrating an example connection structure between a display panel and a touch testing device shown in FIG. 11.

FIG. 12 is a diagram illustrating an example connection structure between a display panel and a touch testing device, shown in FIG. 11.

In the display panel DP2 and the touch testing circuit 120 shown in FIG. 12, elements previously described with reference to FIG. 3 or 7 may be identified by the same reference number without repeating an overlapping description thereof.

The display panel DP of FIG. 7 may include the pad region NDA-PD, on which the signal pads DP-PD as well as the touch pads TS-PD are disposed. By contrast, only the signal pads DP-PD may be disposed on a pad region NDA-PD2 of the display module DM2 of FIG. 12.

The connector CNT may include the first power test pad TDD and the second power test pad TDS, which are electrically connected to the first power pad PDD and the second power pad PDS of the display panel DP2. The connector CNT may further include the touch test pads TPD, which may be electrically connected to the touch-sensing unit TS2 shown in FIG. 11.

The connector CNT may be used to connect the display panel DP2 and the touch-sensing unit TS2 of FIG. 11 to the touch testing circuit 120, as described above, but the inventive concepts are not limited to such a connection structure. The structure for connecting the display panel DP2 and the touch-sensing unit TS2 of FIG. 11 to the touch testing circuit 120 (e.g., using the connector CNT) may be variously changed.

The touch testing circuit 120 may sense capacitance of the display panel DP2 through the connector CNT in response to the voltage control signal CTRL_V and may output the capacitance sensing signal S_CAP corresponding to the sensed capacitance.

As shown in FIGS. 11 and 12, even if the signal pads DP-PD of the display panel DP2 are arranged on a layer different from that for the touch pads (not shown) of the touch-sensing unit TS2, the capacitance of the organic light emitting diode of the display panel DP2 may be measured or tested using the touch testing device. Thus, it is unnecessary to provide an additional capacitance measurement circuit for measuring only the capacitance of the display panel DP.

According to an exemplary embodiment of the inventive concepts, a testing device can be used to measure capacitance of a display panel in a step of testing a touch-sensing unit of a display module. Thus, it is unnecessary to provide an additional testing device for measuring the capacitance of the display panel.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A testing device, comprising:
   touch test pads configured to be electrically connected to touch pads in electrical communication with touch signal lines of a touch-sensing unit of a display module;
   a first power test pad and a second power test pad configured to be electrically connected to a first power pad and a second power pad of the display module;
   a voltage generator configured to provide a first test power voltage and a second power test voltage to the first power test pad and second power test pad;
   a capacitance measurement circuit configured to measure capacitance between the first power test pad and second power test pad; and
   a touch testing circuit configured to output touch test signals for testing the touch-sensing unit to the touch test pads.

2. The testing device of claim 1, wherein the voltage generator changes a voltage level of at least one of the first test power voltage and the second test power voltage, in response to a voltage control signal.

3. The testing device of claim 2, further comprising:
   a connector electrically connecting the touch pads to the touch test pads and electrically connecting the first and second power pads to the first and second power test pads; and
   an interface configured to output the voltage control signal in response to a test control signal received from an outside.

4. The testing device of claim 1, wherein the capacitance measurement circuit is configured to output a capacitance sensing signal corresponding to the measured capacitance.

5. The testing device of claim 1, wherein an operation of the touch testing circuit outputting the touch test signals and an operation of the voltage generator outputting the first test power voltage and the second power test voltage are executed in parallel.

6. The testing device of claim 5, wherein the touch test pads, the first and second power test pads, the voltage generator, and the capacitance measurement circuit are provided as a single integrated circuit.

7. The testing device of claim 1, further comprising a panel testing circuit outputting panel test signals to signal pads of the display module.

8. The testing device of claim 7, wherein the panel testing circuit comprises:
   touch test pads electrically connected to the signal pads of the display module; and
   a test signal generator configured to output the panel test signals to the touch test pads.

9. A testing system, comprising:
   a display module; and
   a testing device,
   wherein the display module comprises:
   a display panel including a display region and a non-display region adjacent to the display region; and
   a touch-sensing unit disposed on the display panel and configured to sense an external input applied to a sensing region overlapped with the display region,
   wherein the display panel comprises:
   touch pads disposed on the non-display region and electrically connected to the touch-sensing unit; and
   a first power pad and a second power pad disposed on the non-display region and electrically connected to the display panel, and
   wherein the testing device comprises:
   touch test pads electrically connected to the touch pads;
   a first power test pad and a second power test pad electrically connected to the first power pad and the second power pad;
   a voltage generator configured to provide a first test power voltage and a second power test voltage to the first power test pad and second power test pad;
   a capacitance measurement circuit configured to measure capacitance between the first power test pad and second power test pad; and
   a touch testing circuit configured to output touch test signals for testing the touch-sensing unit to the touch test pads.

10. The testing system of claim 9, wherein the voltage generator is configured to change a voltage level of at least one of the first test power voltage and the second test power voltage in response to a voltage control signal.

11. The testing system of claim 10, further comprising:
    a connector electrically connecting the touch pads to the touch test pads and electrically connecting the first and second power pads of the display panel to the first and second power test pads; and an interface configured to output the voltage control signal in response to a test control signal received from an outside.

12. The testing system of claim 10, wherein the capacitance measurement circuit is configured to output a capacitance sensing signal corresponding to the measured capacitance.

13. The testing system of claim 10, wherein the display panel comprises a plurality of pixels, which are arranged in the display region and are connected to a plurality of data lines and a plurality of scan lines, and at least one of the plurality of pixels comprises:
 a light-emitting diode including an anode and a cathode;
 a first transistor including a first electrode configured to receive a first power voltage, a second electrode electrically connected to the anode of the light-emitting diode, and a gate electrode;
 a capacitor including a first electrode connected to the first electrode of the first transistor and a second electrode connected to the gate electrode of the first transistor; and
 a second transistor including a first electrode connected to a corresponding one of the plurality of data lines, a second electrode connected to the second electrode of the capacitor, and a gate electrode configured to receive a first scan signal.

14. The testing system of claim 13, wherein the first electrode of the first transistor is electrically connected to the first power pad, and
 the cathode of the light-emitting diode is electrically connected to the second power pad.

15. The testing system of claim 14, wherein the capacitance measurement circuit is configured to output a capacitance sensing signal corresponding to capacitance between the first electrode of the first transistor and the cathode of the light-emitting diode.

16. A testing method using a testing device including touch test pads electrically connected to touch pads of a touch-sensing unit and a first power test pad and a second power test pad electrically connected to a first power pad and a second power pad of a display panel, the testing method comprising:
 providing a first test power voltage and a second power test voltage to the first power test pad and the second power test pad;
 measuring capacitance between the first power test pad and second power test pad; and
 outputting touch test signals for testing the touch-sensing unit to the touch test pads.

17. The method of claim 16, further comprising outputting a capacitance sensing signal corresponding to the measured capacitance.

* * * * *